(12) United States Patent
Shimizu et al.

(10) Patent No.: US 11,525,913 B2
(45) Date of Patent: Dec. 13, 2022

(54) LIGHT DETECTION DEVICE AND ELECTRONIC APPARATUS COMPRISING PLURAL SPAD ARRAYS WITH A PHOTON DETECTION RATE CONTROLLER

(71) Applicant: SHARP KABUSHIKI KAISHA, Sakai (JP)

(72) Inventors: Takayuki Shimizu, Sakai (JP); Takuma Hiramatsu, Sakai (JP); Yoshiki Ikuta, Sakai (JP); Hideki Sato, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 414 days.

(21) Appl. No.: 16/894,093

(22) Filed: Jun. 5, 2020

(65) Prior Publication Data

US 2020/0386889 A1    Dec. 10, 2020

Related U.S. Application Data

(60) Provisional application No. 62/859,306, filed on Jun. 10, 2019.

(51) Int. Cl.
*G01S 7/48*       (2006.01)
*G01S 17/10*      (2020.01)
*G01S 7/4863*     (2020.01)
*G01S 7/484*      (2006.01)
*H01L 31/107*     (2006.01)

(52) U.S. Cl.
CPC .............. *G01S 17/10* (2013.01); *G01S 7/484* (2013.01); *G01S 7/4863* (2013.01); *H01L 31/107* (2013.01)

(58) Field of Classification Search
CPC .......... G01S 17/02; G01S 17/04; G01S 17/06; G01S 17/08; G01S 17/10; G01S 17/42; G01S 7/48; G01S 17/48; G01S 17/88; H01L 31/107; H01L 31/101; H01L 31/09
USPC ............................................. 250/214 R, 221
See application file for complete search history.

(56) References Cited

U.S. PATENT DOCUMENTS

| | | | |
|---|---|---|---|
| 11,159,738 B2 * | 10/2021 | Gnecchi | ............... H04N 5/2355 |
| 2012/0075615 A1 | 3/2012 | Niclass et al. | |
| 2017/0356981 A1 | 12/2017 | Yang et al. | |

FOREIGN PATENT DOCUMENTS

| | | |
|---|---|---|
| JP | 2012-530917 A | 12/2012 |
| JP | 2013-137324 A | 7/2013 |
| JP | 2018-077071 A | 5/2018 |
| WO | 2018/211831 A1 | 11/2018 |

* cited by examiner

*Primary Examiner* — Que Tan Le
(74) *Attorney, Agent, or Firm* — ScienBiziP, P.C.

(57) ABSTRACT

A first SPAD array on which at least one first light beam that is at least one pulse light beam is incident and which is operated in Geiger mode, a second SPAD array on which at least one second light beam resulting from the at least one first light beam reflected by a detection object is incident and which is operated in Geiger mode, a voltage generation unit that applies a reverse bias voltage to the first SPAD array and the second SPAD array, and a SPAD photon detection rate controller that adjusts and controls a SPAD photon detection rate in accordance with a first photon detection rate indicating a rate of the number of at least one pulse signal output by the second SPAD array upon incidence of the at least one second light beam relative to the number of the at least one pulse light beam are included.

10 Claims, 10 Drawing Sheets

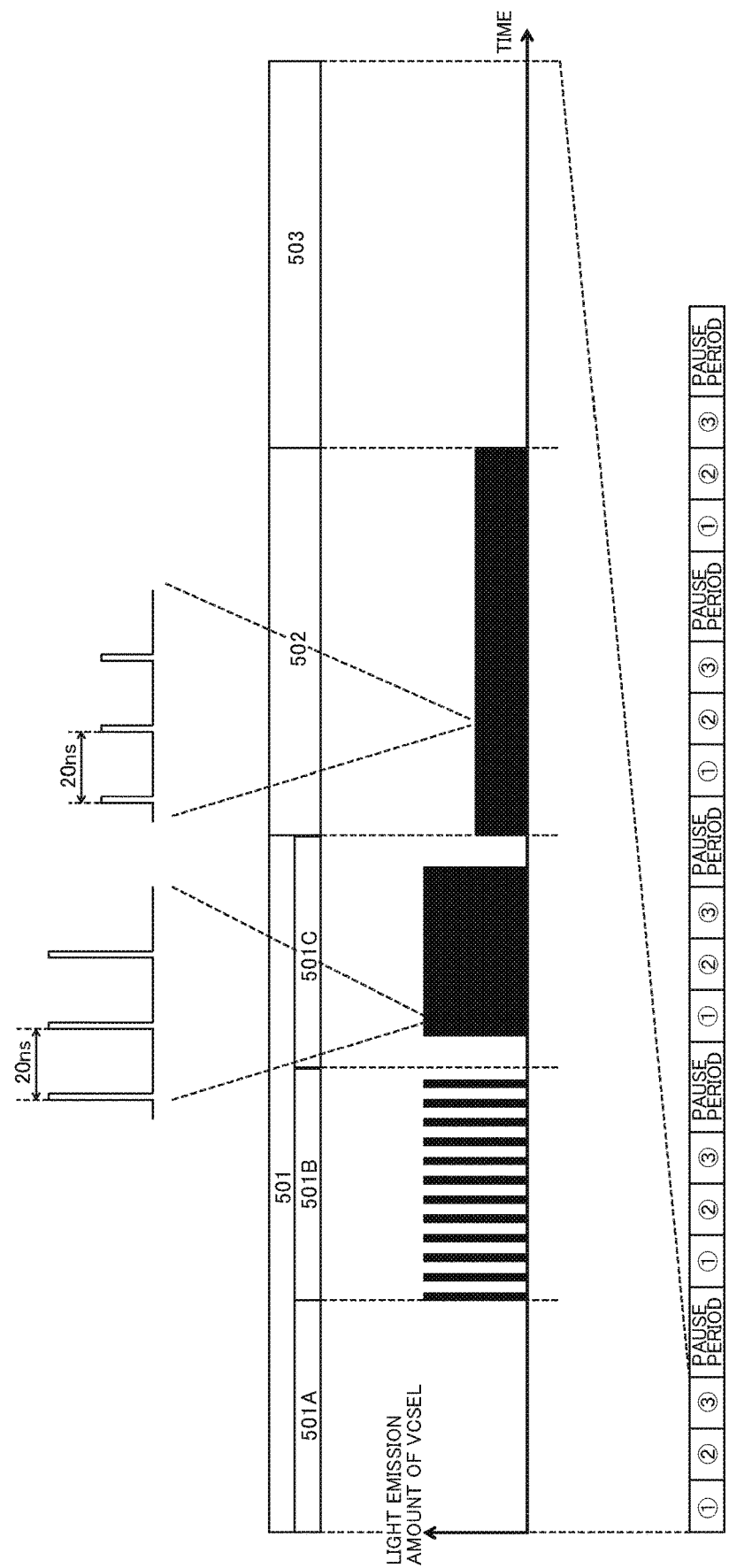

LIGHT DETECTION DEVICE AND ELECTRONIC APPARATUS COMPRISING PLURAL SPAD ARRAYS WITH A PHOTON DETECTION RATE CONTROLLER

TECHNICAL FIELD

The present invention relates to a light detection device utilizing an avalanche effect, and an electronic apparatus.

BACKGROUND ART

In recent years, portable information terminals such as smartphones have widely spread. In addition, with the reduction in the size of cameras, proximity sensors, azimuth sensors, acceleration sensors, angular velocity sensors, illuminance sensors, or the like, various sensors have been mounted on various portable information terminals. For automatic focus (AF) of a camera built into a smartphone, conventionally, an autofocus method of the camera using image contrast has generally been used. However, AF using image contrast has a disadvantage such that, when contrast of an object to be photographed is low due to a dark location or the like, AF speed is notably reduced, and lens focusing becomes sluggish. Thus, there is a demand for a small high-speed range sensor capable of high-speed AF even in dark locations, and mounting of an AF range sensor of a TOF (TOF: Time of Flight) type has recently begun on portable information terminals.

Moreover, a small and lightweight range sensor is also demanded for robots such as drones for the purpose of detecting obstacles. A range sensor of the TOF type that is advantageous for reducing size and weight is useful compared with a range sensor that uses a PSD light-receiving element and that is used in a triangulation method.

It has been conventionally known that an avalanche photodiode operated in Geiger mode is able to detect a single photon. FIG. 10 is a graph illustrating an operation state in Geiger mode in a conventional avalanche photodiode. As illustrated in FIG. 10, the detection of the single photon is achieved by reverse biasing the avalanche photodiode with a voltage greater than a breakdown voltage $V_{BD}$ (point A in FIG. 10). When a photon is incident and causes avalanche amplification, the avalanche photodiode is brought into a metastable state (point B in FIG. 10). The avalanche amplification is quenched by a quenching resistor connected to the avalanche photodiode (point C in FIG. 10), and, at this time, a reverse bias voltage becomes smaller than the breakdown voltage $V_{BD}$. Thereafter, when the reverse bias voltage increases again, the avalanche photodiode is brought into a standby state in Geiger mode and maintains the standby state (point A in FIG. 10) until the next photon is incident. Note that, in FIG. 10, a voltage VHV_v is a voltage value of a power supply with which the reverse bias voltage is applied, and Vex is an overvoltage (difference between the breakdown voltage $V_{BD}$ and the voltage value VHV_v). These are collectively called SPADs (SPAD: Single Photon Avalanche Diode) and are also referred to as single photon avalanche photodiodes.

In this manner, the SPAD is operated in Geiger mode and detects a single photon when the single photon is incident and thus has very high sensitivity to light. Here, the sensitivity of the SPAD (the efficiency of detecting a single photon) varies depending on the wavelength of light received by the SPAD and is several percent to several tens of percent. In addition, when a plurality of SPADs are arranged in an array, the sensitivity (efficiency of detecting a single photon) of all of the SPADs is able to be further enhanced. Here, the sensitivity of the SPAD is the sensitivity with which light emitted from a light-emitting unit and reflected by a detection object is detected by the SPAD, and the sensitivity is able to be enhanced by increasing a light-receiving area of the light. That is, the efficiency of detecting the single photon is enhanced.

As the avalanche photodiode operated in Geiger mode, for example, PTL 1 discloses a light detection device (image acquisition device) that includes a SPAD array and that repeatedly irradiates a detection object with a pulse light beam from a VCSEL, which is a light-emitting unit, repeatedly receives, via the SPAD array, the pulse light beam reflected by the detection object, and acquires an image of the detection object. The light detection device includes the VCSEL and a VCSEL driver that pulse-drives the VCSEL, and a SPAD array on a reference side where the pulse light beam from the VCSEL is directly received and a SPAD array on a return side where the pulse light beam reflected by the detection object is received are arranged. Each of the SPAD arrays is connected to a SPAD front-end circuit and performs waveform shaping of a pulse signal from a SPAD. An output of the SPAD front-end circuit is connected to a TDC (Time to Digital Converter). The TDC digitizes the delay time of the pulse signal from each of the SPADs on the return side and the reference side with a VCSEL pulse driving signal as a start point (start signal). Direct light from the VCSEL is received by the SPAD array on the reference side and reflected light emitted from the VCSEL and reflected by the detection object is received by the SPAD array on the return side. Then, a histogram generation circuit converts a time difference between a pulse light beam irradiating time and a pulse light beam receiving time into histograms as distribution of a plurality of delay times from the TDC. A time difference between centers of gravity of a histogram of output values of the SPAD on the return side and a histogram of output values of the SPAD on the reference side corresponds to a time of flight of light at a distance to the detection object. By calculating the time difference using a calculation circuit, the distance to the detection object is calculated.

Moreover, PTL 2 discloses an optical sensor (range sensor) in which a laser is used for a light-emitting unit and which irradiates a detection object with laser light, receives reflected light from the detection object via a SPAD array, and calculates the distance to the detection object.

CITATION LIST

Patent Literature

[PTL 1] Japanese Unexamined Patent Application Publication No. 2013-137324
[PTL 2] United States Patent Application Publication No. 2017/0356981

SUMMARY OF INVENTION

Technical Problem

However, in a case where a SPAD is used as light-receiving means as in the optical sensor of PTL 1 or 2, the SPAD outputs a detection pulse signal with a certain probability when a single photon is incident. The detection pulse signal is generated with the certain probability for each photon every time a single photon is incident. Therefore, when the number of single photons incident on the SPAD increases, that is, when the intensity of light incident on the SPAD increases, a plurality of detection pulse signals of the SPAD tend to be output.

In particular, in a case of a detection pulse signal of the SPAD on the return side, when the intensity of light incident on the SPAD increases (in other words, when the number of single photons incident on the SPAD increases), the number of single photons incident on the SPAD on the return side with respect to a pulse light beam emitted once by the VCSEL increases, such that there are a plurality of detection pulse signals. This is because the light intensity of received light reaches a saturated operation region of the SPAD above a normal operation region of the SPAD. Then, due to a saturated operation of the SPAD on the return side, the plurality of detection pulse signals are output with respect to a pulse light beam emitted once by the VCSEL, thus posing a problem of distortion in the histogram.

In a case of a TOF range sensor, there is a problem that accuracy of a detection distance decreases because the histogram is distorted. That is, in particular, in a case where a detection object having high reflectivity is at a short distance, the center of gravity of the histogram of the SPAD on the return side is shifted to a shorter side than the center of gravity of the histogram of the SPAD on the reference side, and the distance that is output by the TOF range sensor is output as a distance shorter than the actual distance to the detection object, and accuracy of the detection distance at the short distance is reduced.

In view of the above, the invention aims to achieve a light detection device and an electronic apparatus that have high accuracy of a detection distance even in a case of a detection object at a short distance or a detection object having high reflectivity, for example, by controlling a light emission amount of a light-emitting unit by using a SPAD photon detection rate controller.

(1) In order to solve the aforementioned problems, a light detection device according to an aspect of the invention includes: a first SPAD array on which at least one first light beam that is at least one pulse light beam emitted from a light-emitting unit is incident and which is operated in Geiger mode; a second SPAD array on which at least one second light beam resulting from the at least one first light beam reflected by a detection object is incident and which is operated in Geiger mode; a voltage generation unit that applies a reverse bias voltage to the first SPAD array and the second SPAD array; and a SPAD photon detection rate controller that adjusts and controls a SPAD photon detection rate in accordance with a first photon detection rate indicating a rate of the number of at least one pulse signal output by the second SPAD array upon incidence of the at least one second light beam relative to the number of the at least one pulse light beam.

(2) In order to solve the aforementioned problems, in the light detection device according to an aspect of the invention, in addition to a configuration of (1) described above, the SPAD photon detection rate controller, which controls a light emission amount of the light-emitting unit to be small when the second SPAD array is in a saturated operation region above a normal operation region due to incidence of the second light beam, controls the light emission amount of the light-emitting unit in accordance with whether or not the first photon detection rate exceeds a first setting value that is set in advance.

(3) In order to solve the aforementioned problems, in the light detection device according to an aspect of the invention, in addition to the configuration of (1) described above, the SPAD photon detection rate controller controls the voltage generation unit in accordance with whether or not the first photon detection rate exceeds a first setting value that is set in advance.

(4) In order to solve the aforementioned problems, in the light detection device according to an aspect of the invention, in addition to the configuration of (1) described above, the SPAD photon detection rate controller controls the number of SPADs that constitute at least one SPAD array of the first SPAD array and the second SPAD array in accordance with whether or not the first photon detection rate exceeds a first setting value that is set in advance.

(5) In order to solve the aforementioned problems, in the light detection device according to an aspect of the invention, in addition to the configuration of (1) described above, the SPAD photon detection rate controller controls a light emission amount of the light-emitting unit in accordance with whether or not the second SPAD array is in a saturated operation region above a normal operation region due to incidence of the at least one second light beam.

(6) In order to solve the aforementioned problems, in the light detection device according to an aspect of the invention, in addition to a configuration of any of (1) to (5) described above, the SPAD photon detection rate controller performs control so that the first photon detection rate is 30% or more and 70% or less.

(7) In order to solve the aforementioned problems, in the light detection device according to an aspect of the invention, in addition to a configuration of any of (1) to (6) described above, the SPAD photon detection rate controller controls the light emission amount of the light-emitting unit before a distance between the light detection device and the detection object is measured.

(8) In order to solve the aforementioned problems, in the light detection device according to an aspect of the invention, in addition to a configuration of any of (1) to (7) described above, the SPAD photon detection rate controller, which calculates a photon detection rate of a pulse signal output by the first SPAD array upon incidence of the first light beam and controls the light emission amount of the light-emitting unit to be small in a range where the photon detection rate of the first SPAD array exceeds a second setting value that is set in advance, controls the light emission amount of the light-emitting unit in accordance with a second photon detection rate indicating a rate of the number of at least one pulse signal output by the first SPAD array upon incidence of the at least one first light beam relative to the number of the at least one pulse light beam.

(9) In order to solve the aforementioned problems, in the light detection device according to an aspect of the invention includes, in addition to a configuration of any of (1) to (8) described above, a histogram generation unit that generates a first histogram based on the at least one pulse signal output by the first SPAD array and a second histogram based on the at least one pulse signal output by the second SPAD array, and a distance calculation unit that calculates a distance between the light detection device and the detection object in accordance with a center of gravity of the first histogram that is generated by the histogram generation unit and a center of gravity of the second histogram that is generated by the histogram generation unit.

(10) In order to solve the aforementioned problems, an electronic apparatus according to an aspect of the invention includes the light detection device according to any of (1) to (9) described above.

Advantageous Effects of Invention

According to a light detection device and an electronic apparatus according to an aspect of the invention, it is possible to provide a light detection device and an electronic apparatus that have high accuracy of a detection distance even in a case of a detection object at a short distance or a detection object having high reflectivity.

BRIEF DESCRIPTION OF DRAWINGS

FIG. 5 is a sequence diagram illustrating an example of an operation of the light detection device according to Embodiment 1 of the invention.

DESCRIPTION OF EMBODIMENTS

Figure 1:
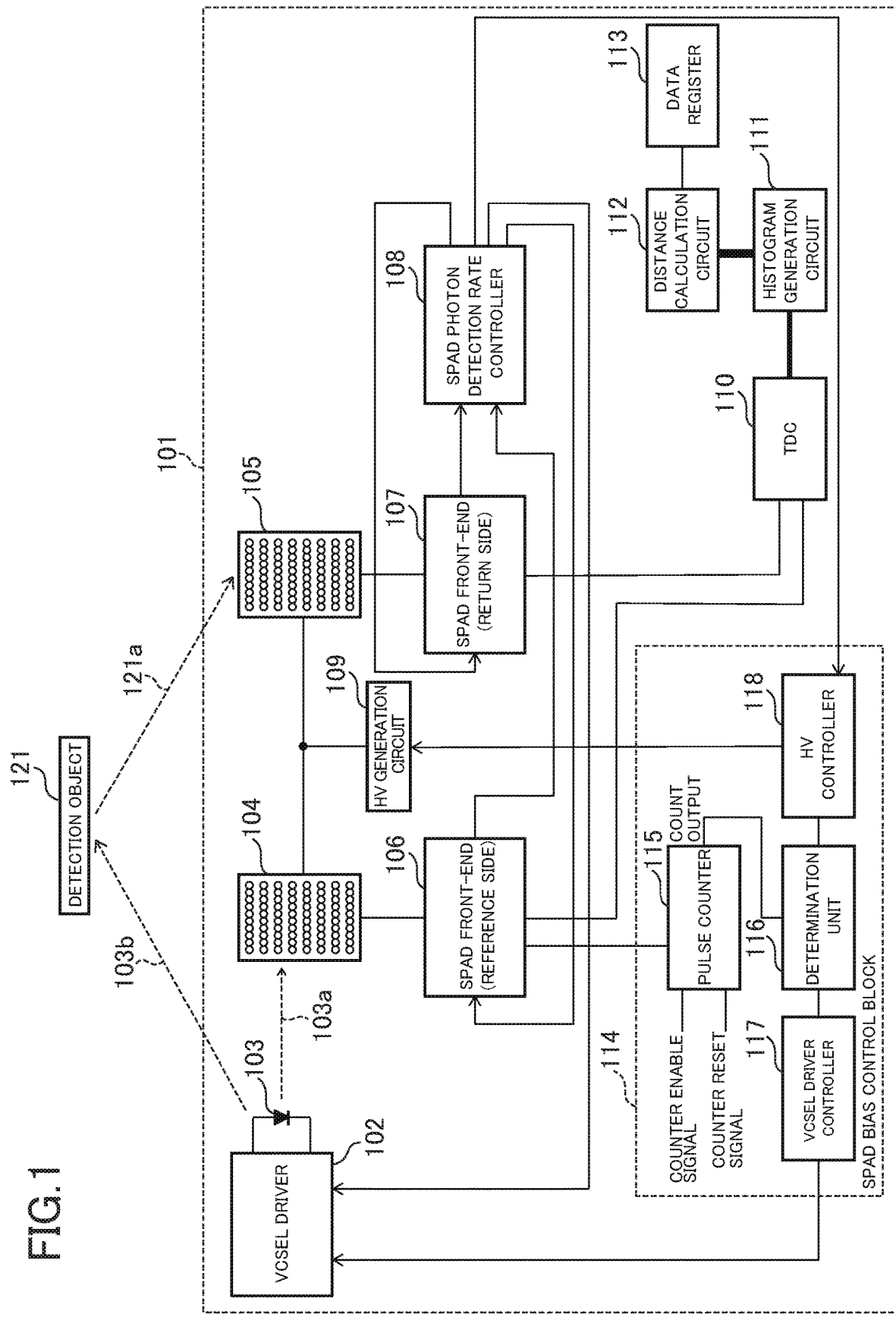
FIG. 1 is a block diagram illustrating an example of a configuration of a light detection device according to Embodiment 1 of the invention.

Embodiments of the invention will be described below with reference to the drawings. Note that, components that are the same or equal in the drawings will be denoted by the same reference sign and redundant description thereof will be omitted.

Embodiment 1

Hereinafter, Embodiment 1 of the invention will be described as follows with reference to FIGS. 1 through 8. FIG. 1 is a block diagram illustrating an example of a structure of a light detection device 101 according to Embodiment 1 of the invention.

As illustrated in FIG. 1, the light detection device 101 in Embodiment 1 includes a VCSEL driver 102, a VCSEL 103 (light-emitting unit), a SPAD array 104 on a reference side (first SPAD array), a SPAD array 105 on a return side (second SPAD array), a SPAD front-end circuit 106 on the reference side, a SPAD front-end circuit 107 on the return side, a SPAD photon detection rate controller 108, an HV generation circuit 109 (voltage generation unit), a TDC 110, a histogram generation circuit 111, a distance calculation circuit 112, a data register 113, and a SPAD bias control block 114 (voltage adjustment unit).

The light detection device 101 is a range sensor of a TOF type that measures a distance to a detection object 121 by using a SPAD.

The VCSEL (VCSEL: Vertical Cavity Surface Emitting Laser) driver 102 drives the VCSEL 103. That is, on the basis of control signals received from the SPAD photon detection rate controller 108 and the SPAD bias control block 114, the VCSEL driver 102 outputs a driving pulse to the VCSEL 103 to cause the VCSEL 103 to emit a pulse light beam. The VCSEL 103 outputs one pulse light beam per driving pulse that is input.

Though details will be described later, the VCSEL driver 102 is controlled on the basis of the control signal from the SPAD photon detection rate controller 108 and reduces a light emission amount of the VCSEL 103 by reducing a driving current of the VCSEL 103, for example, when SPAD photon detection rates at the SPAD arrays 104 and 105 are high. Thereby, the light emission amount of the VCSEL 103 and the photon detection rates at the SPAD arrays 104 and 105 are optimized.

When measuring a distance between the light detection device 101 and the detection object 121, the VCSEL 103 emits pulse light beams to the SPAD array 104 and the detection object 121. At this time, a pulse light beam emitted to the SPAD array 104 by the VCSEL 103 is defined as a first light beam 103a and a pulse light beam emitted to the detection object 121 by the VCSEL 103 is defined as a first light beam 103b. Further, a light beam reflected by the detection object 121 when the first light beam 103b is emitted to the detection object 121 is defined as a second light beam 121a.

The SPAD array 104 and the SPAD array 105 each include a SPAD. The SPAD array 104 directly receives the first light beam 103a that is the pulse light beam from the VCSEL 103 and thereby outputs a pulse signal. Similarly, the SPAD array 105 receives the second light beam 121a that is the pulse light beam emitted to the detection object 121 by the VCSEL 103 and reflected by the detection object 121 and thereby outputs a pulse signal. The SPAD front-end circuit 106 and the SPAD front-end circuit 107 are respectively connected to output sides of the SPAD array 104 and the SPAD array 105. The SPAD front-end circuit 106 and the SPAD front-end circuit 107 respectively perform waveform shaping of the pulse signals received from the SPAD array 104 and the SPAD array 105.

Moreover, a reverse bias voltage is applied to the SPAD array 104 and the SPAD array 105 by the HV generation circuit 109.

The SPAD front-end circuit 106 shapes a waveform of the pulse signal received from the SPAD array 104 and supplies the resultant to the SPAD photon detection rate controller 108, the TDC 110, and the SPAD bias control block 114 that are connected to an output side of the SPAD front-end circuit 106. Similarly, the SPAD front-end circuit 107 shapes a waveform of the pulse signal from the SPAD array 105 and supplies the resultant to the SPAD photon detection rate controller 108 and the TDC 110 that are connected to an output side of the SPAD front-end circuit 107.

Figure 3:
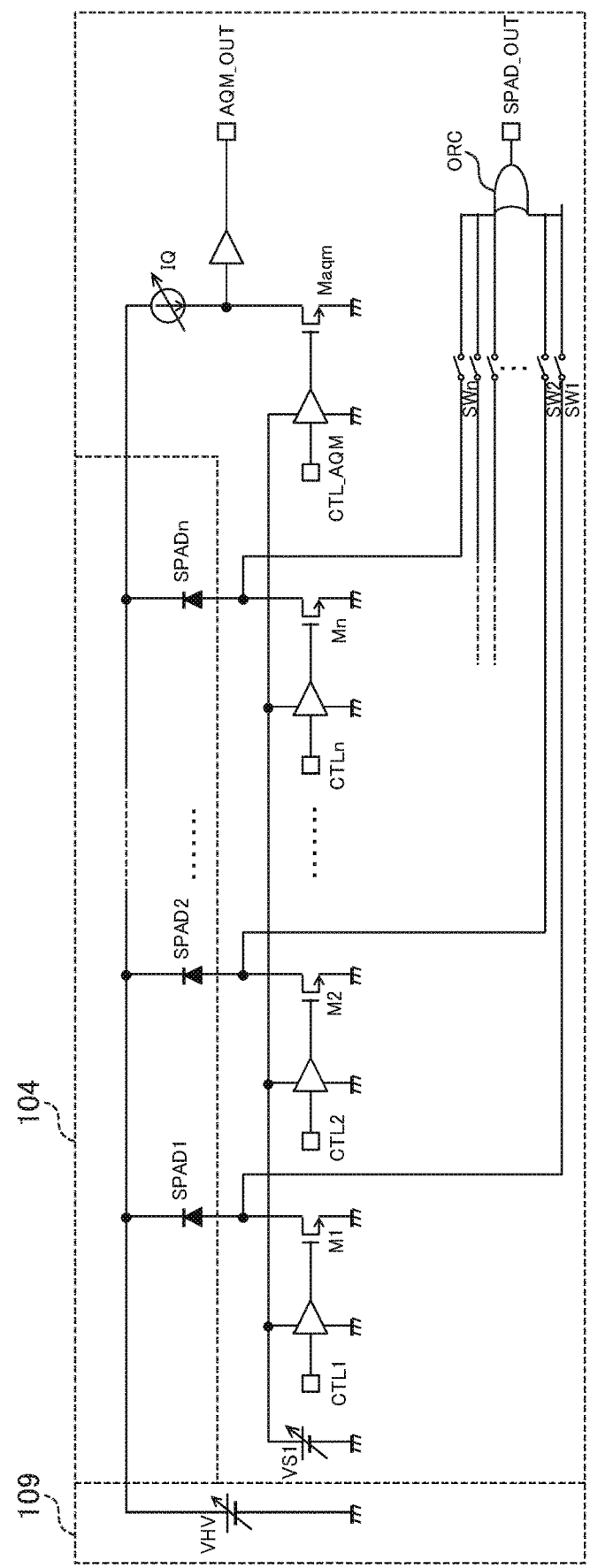
FIG. 3 is a circuit diagram illustrating an example of a SPAD array on a reference side, a SPAD front-end circuit, and an HV generation circuit according to Embodiment 1 of the invention.

Moreover, the SPAD front-end circuits 106 and 107 each include switches SW1 to SWn that adjust, for example, the number of SPADs upon a control signal from the SPAD photon detection rate controller 108 so that a SPAD photon detection rate is optimized. Specifically, as illustrated in FIG. 3, ON/OFF of n SPADs SPAD1 to SPADn that constitute each of the SPAD arrays 104 and 105 is controlled by the switches SW1 to SWn so that a SPAD to be activated is selected.

The SPAD photon detection rate controller 108 calculates the photon detection rates per single photon of the SPAD array 104 and the SPAD array 105, and, on the basis of a result of the calculation, controls at least one of the VCSEL driver 102, the number of SPADs to be activated in each of the SPAD arrays 104 and 105, and an overvoltage (Vex) of the reverse bias voltage applied to the SPAD arrays 104 and 105 and thereby adjusts and controls each of the photon detection rates to be 50% as an optimum value when it is defined that the photon detection rate in a state where a pulse signal is output once with a light pulse cycle of FIG. 5 is 100%. Alternatively, the photon detection rate is desirably adjusted and controlled to be within a range of ±20% or less of the optimum value of 50%.

Specifically, the SPAD photon detection rate controller 108 has a function of, for example, when the photon detection rate of the SPAD array 105 exceeds a first setting value that is set in advance, performing the following control operations 1) to 3) and adjusting the detection rate of the SPAD to be in an optimum condition.

1) To control the light emission amount of the VCSEL 103 to be small, a control signal is output to the VCSEL driver 102.

Figure 6A:
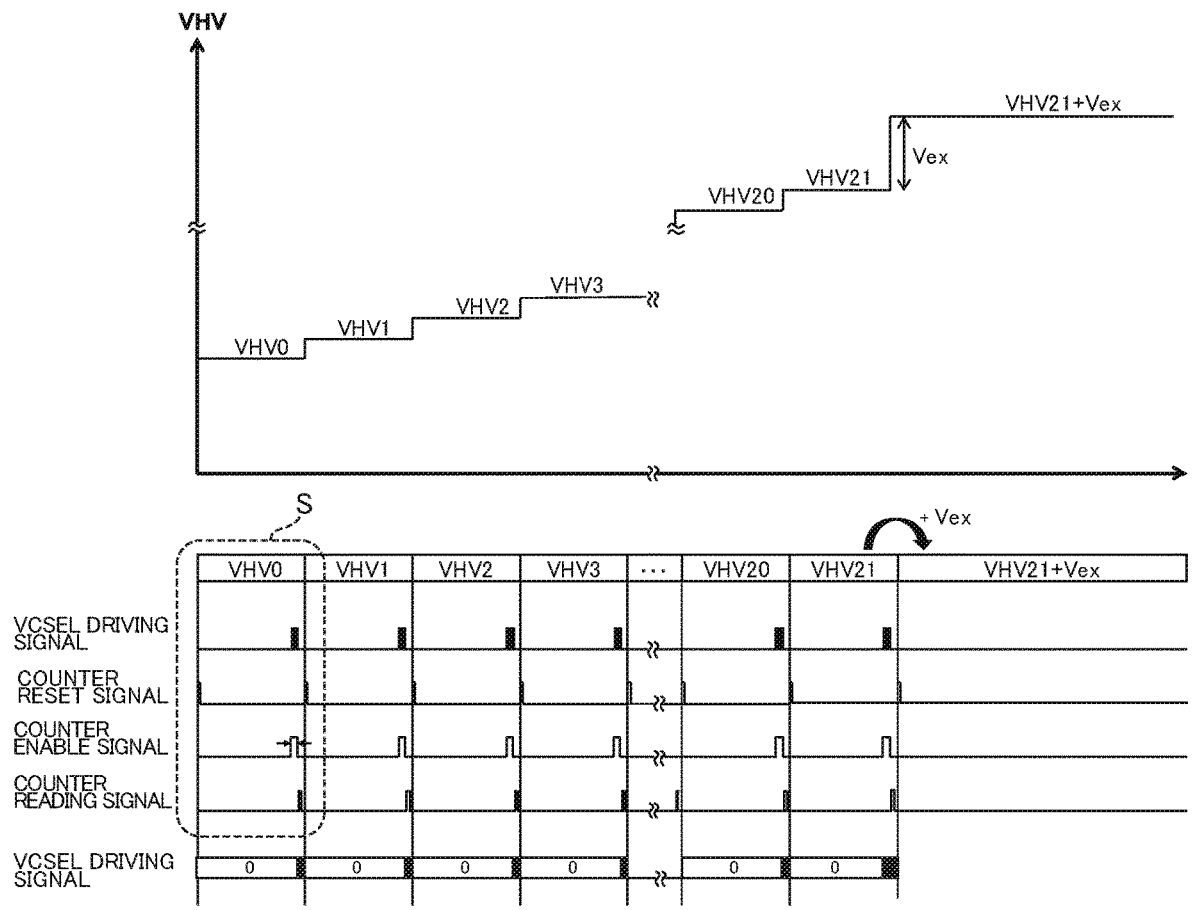
FIG. 6A is a graph illustrating an example of an output of a reverse bias voltage in SPAD arrays according to Embodiment 1 of the invention and a sequence diagram illustrating an example of an operation of a SPAD bias control block.

2) To control an overvoltage Vex of the reverse bias voltage applied to the SPAD arrays 104 and 105, a control signal is output to the HV generation circuit 109. Specifically, the overvoltage Vex indicated in FIG. 6A is proportional to the SPAD photon detection rate. Thus, when the overvoltage Vex is reduced, the photon detection rate is lowered, and when the overvoltage Vex is increased, the photon detection rate is increased.

3) Instead of 1) above, to control by the switches SW1 to SWn the number of activated SPADs, which are used for detection in each of the SPAD arrays 104 and 105, control signals are output to the SPAD front-end circuits 106 and 107. Specifically, as illustrated in FIG. 3, the switches SW1 to SWn for selecting a SPAD are provided between an OR circuit ORC and the SPADs SPAD1 to SPADn and ON/OFF of the switches SW1 to SWn is controlled, so that the number of SPADs to be activated in each of the SPAD arrays 104 and 105 is able to be reduced and the photon detection rate is able to be lowered.

Here, the first setting value is a threshold value that is stored, for example, in the SPAD photon detection rate controller 108 and that is used to determine, on the basis of the photon detection rate, whether the SPAD array 105 is operated in the normal operation region or operated in the saturated operation region. The photon detection rate is, for example, a rate of the number of pulse signals output by a SPAD that receives a pulse light beam, which is output by the VCSEL 103 in a given period, relative to the number of pulse light beams. Note that, since the number of pulse light beams output by the VCSEL 103 is equal to a pulse number of the driving pulse of the VCSEL driver 102, the pulse number of the driving pulse of the VCSEL driver 102 may be used as the number of pulse light beams output by the VCSEL 103. For example, since the SPAD outputs a pulse signal multiple times per pulse light beam in the saturated operation region, the first setting value used for determining the normal operation region or the saturated operation region is set to 1.

In this case, when the number of output signals output by the SPAD array 105 relative to the pulse number of the driving pulse of the VCSEL driver 102 is larger than the first setting value (for example, photon detection rate >1), the SPAD photon detection rate controller 108 determines that the operation is performed in the saturated operation region and outputs the control signal to the VCSEL driver 102 to control the light emission amount of the VCSEL 103 to be small. Alternatively, when the number of output signals output by the SPAD array 105 relative to the pulse number of the driving pulse of the VCSEL driver 102 is equal to or less than the first setting value (for example, photon detection rate ≤1), the SPAD photon detection rate controller 108 determines that the operation is performed in the normal operation region and keeps the light emission amount of the VCSEL 103 as is. Thereby, even when the SPAD array 105 itself is saturated and is in the saturated operation region where the pulse signal is output multiple times, for example, upon incidence of the second light beam 121a of one pulse, the control signal is output to the VCSEL driver 102 to control the light emission amount of the VCSEL 103 to be small.

Moreover, a second setting value is provided for the photon detection rate of the SPAD array 104 to ensure the photon detection rate at a minimum output level needed to measure the distance between the light detection device 101 and the detection object 121, and the SPAD photon detection rate controller 108 outputs the control signal to the VCSEL driver 102 so as to reduce the light emission amount of the VCSEL 103 in a range not below the second setting value.

Specifically, on the basis of the output number of pulse signals of the SPAD array 104 and the output number of pulse signals of the SPAD array 105 relative to the pulse number of the driving pulse of the VCSEL driver 102, the SPAD photon detection rate controller 108 calculates the photon detection rates of the respective SPAD array 104 and SPAD array 105, respectively. Then, the photon detection rates that are calculated are compared to two setting values that are set in advance.

Here, the two setting values refer to the first setting value (for example, proper maximum value) with which it is determined whether the SPAD array 105 is in the normal operation region or the saturated operation region and to the second setting value (proper minimum value) with which the minimum output level of the SPAD array 104, which is needed to measure the distance between the light detection device 101 and the detection object 121, is ensured.

With the two setting values, in a case where the photon detection rate of the SPAD array 105 exceeds the first setting value, that is, in a case where the photon detection rate is larger than a normal photon detection rate needed to measure the distance between the light detection device 101 and the detection object 121, for example, in a case where the detection object 121 is at a short distance or a case where the detection object 121 has high reflectivity, the SPAD photon detection rate controller 108 outputs the control signal to the VCSEL driver 102 to reduce the light emission amount of the VCSEL 103. Note that, in the same manner, in a case where the photon detection rate of the SPAD array 104 exceeds the first setting value, the SPAD photon detection rate controller 108 may output the control signal to the VCSEL driver 102 to reduce the light emission amount of the VCSEL 103, similarly.

Moreover, to the contrary, by detecting whether the photon detection rate of the SPAD array 104 is smaller, the SPAD photon detection rate controller 108 is able to ensure the light emission amount of the VCSEL 103, which is needed for the SPAD array 104 to measure the distance between the light detection device 101 and the detection object 121, and to ensure the minimum output level that enables the SPAD array 104 to detect a single photon.

Thus, in a case where the distance between the light detection device 101 and the detection object 121 is short or in a case where the detection object 121 has high light reflectivity, the SPAD photon detection rate controller 108 optimizes the photon detection rate of the SPAD array 105 to be a normal optimum value. Thus, accuracy of the detection distance is able to be enhanced without being affected by the short distance or a difference in reflectivity. That is, there is no result of a conventional case where the photon detection rate is inappropriately increased and a distance shorter than an actual distance to the detection object is output.

The HV generation circuit 109 generates the reverse bias voltage to be applied to the SPAD array 104 and the SPAD array 105.

The TDC (TDC: Time to Digital Converter) 110 digitizes, by using a VCSEL pulse driving signal with which the VCSEL driver 102 drives the VCSEL 103 as a start point (start signal), a delay time of the pulse signal received by the SPAD front-end circuit 106 and a delay time of the pulse signal received by the SPAD front-end circuit 107, and outputs the respective digitized delay times to the histogram generation circuit 111. Here, each of the delay times denotes a time difference of the pulse signal, which is received and output by the SPAD array 104 or 105, with respect to the control signal of the VCSEL driver 102 that causes the VCSEL 103 to emit light. That is, with each of the pulses of the VCSEL pulse driving signal as a reference, the TDC 110 digitizes delay times of respective pulses of the pulse signals received by the SPAD front-end circuits 106 and 107.

On the basis of the output from the TDC 110, the histogram generation circuit 111 converts the distribution of delay times of the respective pulses of the pulse signal received by the SPAD front-end circuit 106 into a histogram and converts the distribution of delay times of the respective pulses of the pulse signal received by the SPAD front-end circuit 107 into a histogram. Here, a time difference between centers of gravity of the histograms of the pulse signal supplied from the SPAD front-end circuit 106 and the pulse signal supplied from the SPAD front-end circuit 107 corresponds to a time of flight of light, which corresponds to the distance between the light detection device 101 and the detection object 121.

On the basis of an output from the histogram generation circuit 111, the distance calculation circuit 112 calculates the center of gravity of the histogram on the SPAD array 104 side, the center of gravity of the histogram on the SPAD array 105 side, and the time difference between the centers of gravity of both of the histograms. Then, the time difference is converted into a distance on the basis of distance conversion data stored in the data register 113 in advance. This enables the light detection device 101 to calculate the distance from the light detection device 101 to the detection object 121. Note that, a method by which the distance calculation circuit 112 calculates the distance from the light detection device 101 to the detection object 121 on the basis of the time difference between the centers of gravity of the histograms is achievable by a known technique and differs from a point of the invention, therefore, detailed description thereof will be omitted.

The data register 113 stores, as a record, the distance between the light detection device 101 and the detection object 121, which is calculated by the distance calculation circuit 112.

The SPAD bias control block 114 includes a pulse counter 115, a determination unit 116, a VCSEL driver controller 117, and an HV controller 118. The SPAD bias control block 114 adjusts an output voltage of the HV generation circuit 109 in accordance with the presence or absence of a pulse signal output from the SPAD array 104 on the reference side. The determination unit 116, the VCSEL driver controller 117, and the HV controller 118 are realized by, for example, a hardware circuit. Moreover, the determination unit 116, the VCSEL driver controller 117, and the HV controller 118 may be realized by using a CPU (Central Processing Unit) in such a manner that the CPU reads and executes a program stored in a storage unit (not illustrated) of the SPAD bias control block 114.

When the reverse bias voltage to be applied to the SPAD array 104 and the SPAD array 105 is set, the pulse counter 115 counts the pulse signals output from the SPAD array 104.

The determination unit 116 determines a pulse number of pulses output from the pulse counter 115.

The VCSEL driver controller 117 controls the HV controller 118, which controls the HV generation circuit 109, and the VCSEL driver 102 in accordance with a determination result determined by the determination unit 116. Thereby, the VCSEL driver controller 117 is able to control the VCSEL 103 and the HV generation circuit 109 in accordance with the determination result determined by the determination unit 116.

Figure 2:
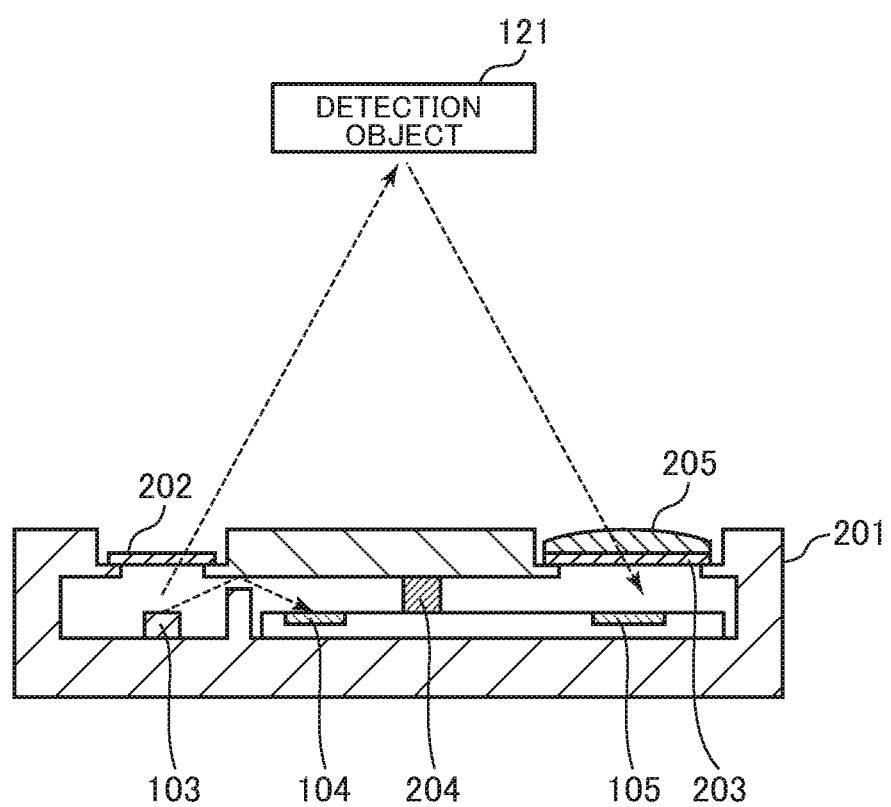
FIG. 2 is a sectional view illustrating an example of a structure of the light detection device according to Embodiment 1 of the invention.

FIG. 2 is a sectional view illustrating an example of a structure of the light detection device 101 according to Embodiment 1 of the invention. The light detection device 101 in Embodiment 1 includes a light detection device main body 201, optical filters 202 and 203, a light shielding wall 204, and a condensing lens 205 as illustrated in FIG. 2.

In the light detection device 101, the VCSEL 103, the SPAD array 104, and the SPAD array 105 are arranged in the light detection device main body 201. The structure is such that only the first light beam 103a emitted by the VCSEL 103 is incident on the SPAD array 104 and only the second light beam 121a that is reflected light from the detection object 121 is incident on the SPAD array 105.

Specifically, the light shielding wall 204 is arranged between the SPAD array 104 and the SPAD array 105. This provides a structure in which the first light beam 103a emitted by the VCSEL 103 does not directly enter the SPAD array 105. That is, the structure is such that only the second light beam 121a that is reflected light from the detection object 121 is incident on the SPAD array 105.

The optical filters 202 and 203 are bandpass filters that allow a wavelength in a narrow range around an emission wavelength (an infrared ray is used, and the wavelength is usually 850 nm or 940 nm) of the VCSEL 103 to pass therethrough and have a configuration such that an erroneous response of the SPAD due to disturbance light hardly occurs.

To enhance the photon detection rate for a long distance or the like, the condensing lens 205 is arranged above the optical filter 203 in the light detection device 101 as illustrated in FIG. 2.

(Configurations of SPAD Array and SPAD Front-End Circuit)

Though description will be given below by taking the SPAD array 104 and the SPAD front-end circuit 106 as an example, similar configurations are also applied to the SPAD array 105 and the SPAD front-end circuit 107.

FIG. 3 is a circuit diagram illustrating an example of the SPAD array 104, the SPAD front-end circuit 106, and the HV generation circuit 109 according to Embodiment 1 of the invention. As illustrated in FIG. 3, the SPAD array 104 is constituted by n SPADs SPAD1 to SPADn. All of cathodes of the SPAD SPAD1 to the SPAD SPADn are connected to a high-voltage power supply VHV that applies a bias voltage and a current source IQ. Moreover, anodes of the SPAD SPAD1 to the SPAD SPADn are connected to an active-quenching circuit constituted by n NMOS transistors M1 to Mn that have the same size. Furthermore, the anodes of the SPAD SPAD1 to the SPAD SPADn are connected to the OR circuit ORC. The OR circuit ORC receives outputs from the SPAD SPAD1 to the SPAD SPADn, and outputs a result calculated from the outputs to a terminal SPAD_OUT.

The SPAD front-end circuit 106 includes the active-quenching circuit, the OR circuit ORC, and the terminal SPAD_OUT.

The active-quenching circuit includes the NMOS transistors M1 to Mn and a terminal AQM_OUT.

Drains of the NMOS transistors M1 to Mn that are configured in the active-quenching circuit are respectively connected to the SPAD SPAD1 to the SPAD SPADn. Gates of the NMOS transistors M1 to Mn are respectively connected to terminals CTL1 to CTLn.

(Operation of SPAD Front-End Circuit)

An operation below is an operation applied to both of the SPAD front-end circuits 106 and 107.

A current waveform of a pulse signal output from each of the SPAD SPAD1 to the SPAD SPADn is converted into a voltage waveform of a pulse waveform by the active-quenching circuit. That is, the pulse signal output from each of the SPAD SPAD1 to the SPAD SPADn is converted from a current into a voltage. The pulse signal subjected to the voltage conversion is transmitted to the OR circuit ORC, and the pulse signal is output from the terminal SPAD_OUT. Thereby, in a case where a pulse signal is output from any one of the SPAD SPAD1 to the SPAD SPADn, an output signal is to be output from the terminal SPAD_OUT. Therefore, it is possible to enhance sensitivity of the light detection device 101 by using a large number of SPADs.

(Method of Adjusting Resistance Value of Active-Quenching Circuit)

Figure 4:
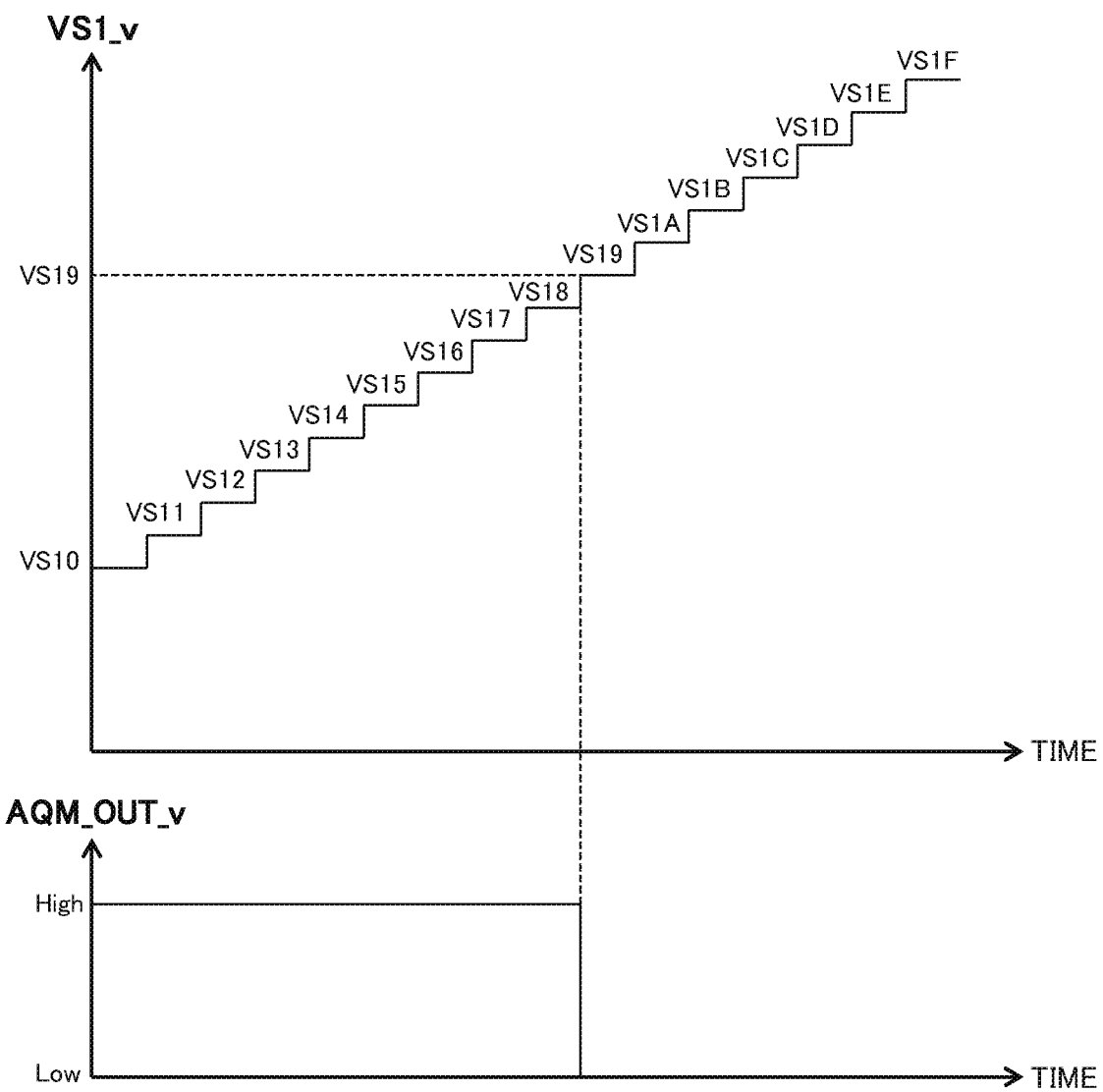
FIG. 4 is a graph illustrating an example of outputs of a power supply and a terminal of an active-quenching circuit according to Embodiment 1 of the invention.

A method of adjusting a resistance value of the active-quenching circuit will be described with reference to FIG. 4. FIG. 4 is a graph illustrating an example of outputs of the power supply and the terminal of the active-quenching circuit according to Embodiment 1 of the invention.

As illustrated in FIG. 3, the current source IQ is connected to the active-quenching circuit. The current source IQ is able to change a current value to any value with a constant current source. A configuration is such that, when a terminal CTL_AQM is at a High level, a gate voltage of an NMOS transistor Maqm comes to have a voltage value $VS1\_v$ of a power supply VS1.

The resistance value of the active-quenching circuit is set by using a current value of the SPAD SPAD1 to the SPAD SPADn, which is output from the SPAD front-end circuit 106, as a current value IQ v of the current source IQ. Moreover, by setting the terminal CTL_AQM to be at the High level, the voltage value $VS1\_v$ of the power supply VS1 is raised in a stepwise manner as illustrated in FIG. 4.

When the voltage value $VS1\_v$ of the power supply VS1 is raised, the gate voltage of the NMOS transistor Maqm is raised. Thereby, a source-gate voltage of the NMOS transistor Maqm becomes great and ON resistance of the NMOS transistor Maqm changes and becomes small. The voltage value $VS1\_v$ of the power supply VS1 may be raised at equal intervals or unequal intervals.

The voltage $VS1\_v$ of the power source VS1 (VS19 in FIG. 4) when the voltage value $VS1\_v$ of the power supply VS1 is raised and a level of a voltage AQM_OUT_v of the terminal AQM_OUT is reversed from the High level to a Low level is decided as a control voltage of the active-quenching circuit. In accordance with the control voltage decided at this time, the resistance value of quenching resistor of the active-quenching circuit is also decided.

After the resistance value of the quenching resistor of the active-quenching circuit is decided, a reverse bias voltage to be applied to each of the SPADs of the SPAD array 104 and the SPAD array 105 is adjusted, so that it is possible to perform more accurate control with the reverse bias voltage.

(Operation of Light Detection Device)

An operation of the light detection device 101 in Embodiment 1 will be described with reference to FIG. 5. FIG. 5 is a sequence diagram illustrating an example of the operation of the light detection device 101 according to Embodiment 1 of the invention.

As to the light detection device 101 in Embodiment 1, one ranging operation is roughly divided into three operation sequences. The three operations mean a pre-measurement setting period 501, a distance measurement period 502, and a distance measurement period 503.

The pre-measurement setting period 501 is divided into a quenching resistance value setting period 501A, a VHV voltage setting period 501B, and a SPAD photon detection rate setting period 501C. The quenching resistance value setting period 501A is provided first, and then, the VHV voltage setting period 501B is provided, and the SPAD photon detection rate setting period 501C is provided thereafter. The pre-measurement setting period 501 is a period during which a quenching resistance value, a VHV voltage, and a SPAD photon detection rate are set before the distance to the detection object 121 is actually measured.

In the quenching resistance value setting period 501A, the resistance value of the active-quenching circuit is set. After the setting of the resistance value of the active-quenching circuit ends, the VHV voltage setting period 501B comes next.

In the VHV voltage setting period 501B, the reverse bias voltage (voltage of the power supply VHV) for the SPAD array 104 and the SPAD array 105 is set, so that it is possible to cause the SPAD array 104 and the SPAD array 105 to be operated in an optimum Geiger mode before the distance between the light detection device 101 and the detection object 121 is measured.

Figure 6B:
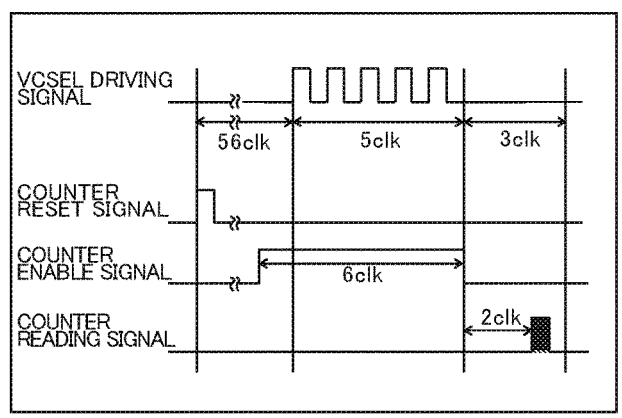
FIG. 6B is an enlarged view in which a part indicated by a broken line S in FIG. 6A is enlarged.

A sequence operation of setting the voltage $VHV\_v$ of the power supply VHV in the VHV voltage setting period 501B will be described with reference to FIG. 6. FIG. 6A is a graph illustrating an example of an output of the reverse bias voltage in the SPAD array 104 and the SPAD array 105 according to Embodiment 1 of the invention and a sequence diagram illustrating an example of an operation of the SPAD bias control block 114. FIG. 6B is an enlarged view in which a part indicated by a broken line S in FIG. 6A is enlarged.

As illustrated in FIG. 6A, first, the SPAD bias control block 114 raises the reverse bias voltage (voltage $VHV\_v$ of the power supply VHV), which is to be applied to the SPAD array 104 and the SPAD array 105, from a low voltage to a high voltage, as the sequence of setting the voltage of the power supply VHV in the VHV voltage setting period 501B. The voltage $VHV\_v$ of the power supply VHV starts from an initial value VHV0. A counter reset signal is input to the pulse counter 115 immediately after the reverse bias voltage VHV0 is applied to the SPAD array 104 and the SPAD array 105. Thereby, the SPAD bias control block 114 resets the pulse counter 115 to reach 0 count. Thereafter, the VCSEL driver controller 117 controls, with a VCSEL driving signal, the VCSEL 103 to perform pulse emission five times with a light emission amount that is set in advance. A pulse number of the VCSEL 103 is five here, but may be another pulse number.

Here, as illustrated in FIG. 6B, the SPAD bias control block 114 enables a counter enable signal of the pulse counter 115 during a period when the VCSEL 103 performs pulse emission. That is, the SPAD bias control block 114 adjusts the reverse bias voltage during the period when the VCSEL 103 emits light. Then, the SPAD bias control block 114 counts, by the pulse counter 115, a pulse signal output from the SPAD array 104. At this time, a timing when the counter enable signal is enabled is a timing before the VCSEL 103 starts the pulse emission. Thereby, it is possible to prevent the pulse counter 115 from missing count of the pulse signal.

Thereafter, the pulse counter 115 sets a counter reading signal to be at a High level and transmits the count number to the determination unit 116. Here, when the determination unit 116 determines that the count number of the pulse signal output from the SPAD array 104 is smaller than the pulse number that the VCSEL 103 is caused to emit light, the HV controller 109 raises the voltage VHV_v of the power supply VHV from VHV0 to VHV1. Thereafter, a similar operation is performed.

At this time, a step at which the HV controller 109 raises the voltage VHV_v of the power supply VHV may be performed with an equal voltage or may not be performed with an equal voltage. As an example in which the step is not performed with an equal voltage, for example, VHV may not be changed in a stepwise manner but may be changed linearly in an analog manner.

Here, for example, a case where an output of the pulse counter 115 is five or more when the voltage VHV_v of the power supply VHV is repeatedly raised and the voltage VHV_v of the power supply VHV reaches VHV21 will be described. In this case, the SPAD bias control block 114 determines that VHV21 is a breakdown voltage $V_{BD}$ of the SPAD. At this time, the SPAD bias control block 114 controls the HV generation circuit 109 so as to generate a voltage higher than the breakdown voltage $V_{BD}$ by an amount of the overvoltage Vex in order to operate the SPAD array 104 and the SPAD of the SPAD array 104 in Geiger mode.

In the distance measurement period 502, the HV controller 118 sets the reverse bias voltage, which is to be applied to the SPAD array 104 and the SPAD array 105, to be VHV21+Vex. Here, Vex may depend on temperature.

Moreover, before the distance measurement period 502, the HV controller 118 controls the reverse bias voltage to be applied to the SPAD array 104 and the SPAD array 105, as described above.

Accordingly, the SPAD bias control block 114 adjusts the reverse bias voltage in accordance with the pulse number of the pulse signal that is output by the SPAD array 104 correspondingly to light incident on the SPAD array 104. As a result, even when temperature changes or the breakdown voltage $V_{BD}$ of the SPAD varies depending on a process condition, the light detection device 101 is able to cause the SPAD array 104 and the SPAD array 105 to be stably operated in the optimum Geiger mode.

Thereby, when the distance between the light detection device 101 and the detection object 121 is measured, it is possible to perform more accurate control with a reverse bias voltage. After the setting of the reverse bias voltage ends, the SPAD photon detection rate setting period 501C comes next.

In the SPAD photon detection rate setting period 501C, the SPAD photon detection rate controller 108 calculates a photon detection rate on the basis of the pulse signal output by the SPAD array 105 upon incidence of the second light beam 121a. The photon detection rate is, for example, a rate of the number of pulse signals output by the SPAD that receives a pulse light beam, which is output by the VCSEL 103 in a given period, relative to the number of pulse light beams. Specifically, the photon detection rate is, for example, a rate of the number of pulse signals output by the SPAD array 105 relative to the number of pulse light beams output by the VCSEL 103 in the SPAD photon detection rate setting period 501C. Note that, since the number of pulse light beams output by the VCSEL 103 in the given period is equal to a pulse number of the driving pulse of the VCSEL driver 102, the pulse number of the driving pulse of the VCSEL driver 102 may be used as the number of pulse light beams output by the VCSEL 103.

Next, the photon detection rate that is calculated and the first setting value that is set in advance are compared, for example, in a tail region in the SPAD photon detection rate setting period 501C. Note that, in FIG. 5, in the SPAD photon detection rate setting period 501C, the VCSEL performs constant pulse emission at a cycle of 20 ns with the same light emission amount as that in the VHV voltage setting period 501B.

Here, in a case where the photon detection rate based on the pulse signal output by the SPAD array 105 is larger than the first setting value, the SPAD photon detection rate controller 108 outputs a control signal to the VCSEL driver 102 to make the light emission amount of the VCSEL 103 smaller than the light emission amount in the SPAD photon detection rate setting period 501C. That is, as to the SPAD array 105 that usually performs one pulse output per single photon, for example, in a case where the distance between the light detection device 101 and the detection object 121 is short or a case where reflectivity of the detection object 121 is high, intensity of light emission of the second light beam 121a that reaches the SPAD array 105 is increased, so that the number of pulse outputs generated for the single photon in the SPAD array 105 increases, that is, the detection rate has a value exceeding 1. Therefore, in order to suppress excessive generation of the pulse output, the SPAD photon detection rate controller 108 outputs the control signal to the VCSEL driver 102 so as to reduce the light emission amount of the VCSEL 103. For example, FIG. 5 illustrates an example in which control is performed so that the light emission amount of the VCSEL 103 in the distance measurement period 502 is 50% of the light emission amount of the VCSEL 103 in the SPAD photon detection rate setting period 501C.

Similarly, the SPAD photon detection rate controller 108 may calculate the photon detection rate based on the pulse signal output by the SPAD array 104 upon incidence of the first light beam 103a and compare the calculated photon detection rate to the second setting value that is set in advance, and when the photon detection rate is larger than the second setting value, the SPAD photon detection rate controller 108 may output the control signal to the VCSEL driver 102 to reduce the light emission amount of the VCSEL 103. FIG. 5 illustrates an example in which control is performed so that light emission is performed with the light emission amount of the VCSEL fixed in the SPAD photon detection rate setting period 501C and the light emission amount of the VCSEL is then reduced on the basis of an output from the SPAD photon detection rate controller 108 in the distance measurement period 502. When the setting of the SPAD photon detection rate ends as described above, the distance measurement period 502 comes next.

In FIG. 5, in the SPAD photon detection rate setting period 501C, the VCSEL 103 performs light emission by using pulses at the same pulse cycle as that in the distance measurement period 502 with the light emission amount in the VHV voltage setting period 501B. At this time, the SPAD photon detection rate controller 108 detects the SPAD photon detection rate. Moreover, the SPAD photon detection rate controller 108 is set so that the light emission amount of the VCSEL 103 is controlled on the basis of a detection result of the SPAD photon detection rate so that the driving current of the VCSEL is controlled to be small and the VCSEL 103 performs light emission with a small amount of light in the distance measurement period 502.

In the distance measurement period 502, the light detection device 101 causes the VCSEL 103 to emit light with the light emission amount of the VCSEL 103 based on the output from the SPAD photon detection rate controller 108 and starts an operation related to measurement of the distance between the light detection device 101 and the detection object 121, so that delay times (pulse data that is a source of information about the distance between the light detection device 101 and the detection object 121) of pulses of pulse signals from the SPAD front-end circuits 106 and 107 with respect to the VCSEL pulse driving signal are digitized in the TDC 110. When measurement of the distance between the light detection device 101 and the detection object 121 ends, the distance measurement period 503 comes next.

Figure 7:
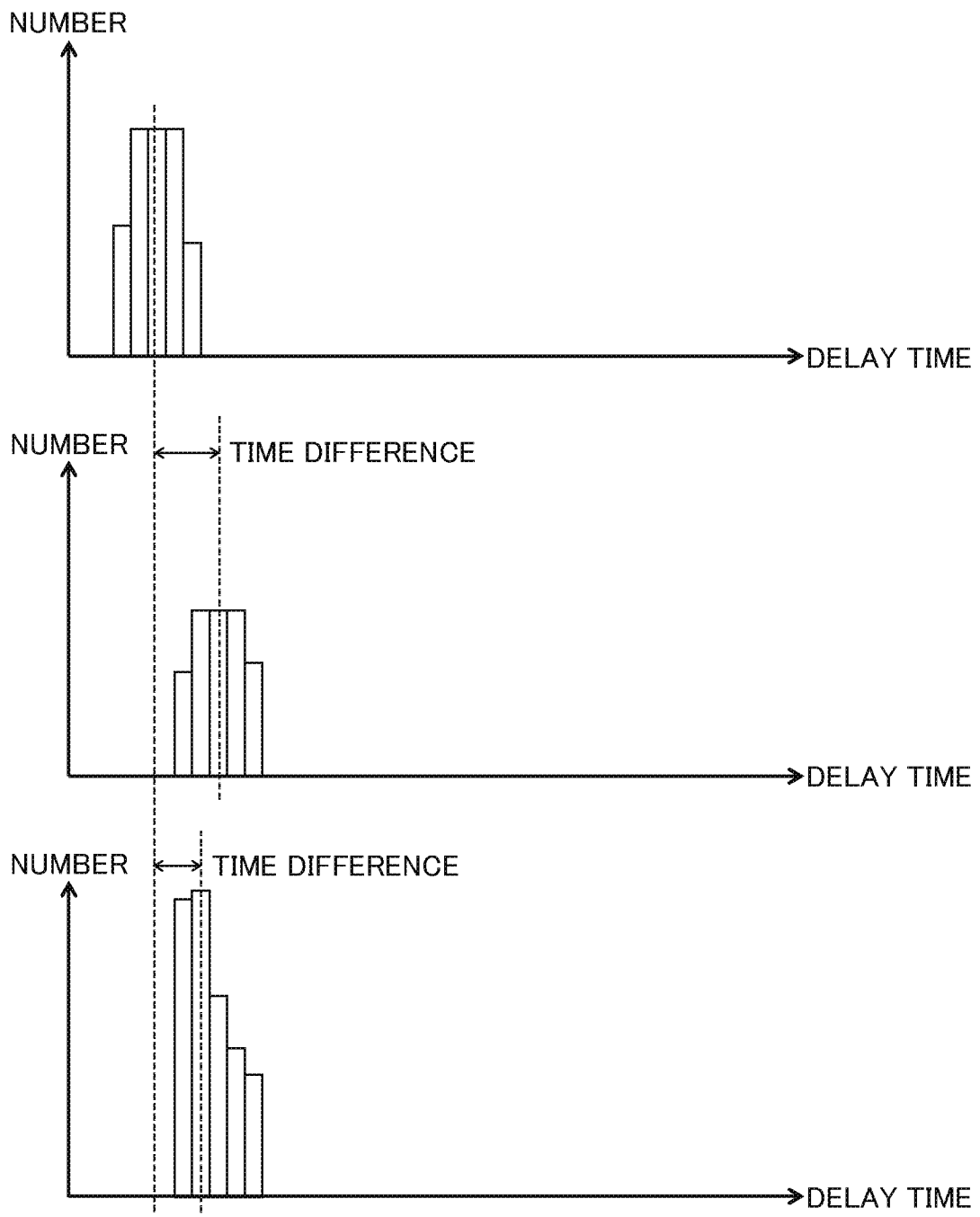
FIG. 7 illustrates an example of a histogram output by a histogram generation circuit according to Embodiment 1 of the invention.

In the distance measurement period 503, first, the histogram generation circuit 111 converts distribution of a plurality of delay times digitized by the TDC 110 into a histogram. FIG. 7 illustrates a histogram generated by the histogram generation circuit 111. In FIG. 7, an example of a histogram of the reference side is indicated in an upper stage, an example of a histogram of the return side when the SPAD photon detection rate is low is indicated in a middle stage, and an example of a histogram of the return side when the SPAD photon detection rate is high is indicated in a lower stage. That is, the histogram in the middle stage is a histogram after the light emission amount of the VCSEL 103 is adjusted by the SPAD photon detection rate controller 108. The histogram in the lower stage is used for comparison to the histogram in the middle stage and is a histogram when the light emission amount of the VCSEL 103 is not adjusted.

In this manner, as indicated in the histogram in the middle stage in FIG. 7, a normal histogram is able to be made by the SPAD photon detection rate controller 108. Moreover, there is also a side effect that power consumption is reduced by lowering the driving current of the VCSEL 103.

Note that, in the histogram in the lower stage in FIG. 7, the histogram is distorted and a time difference is shortened. That is, in a case where the light detection device 101 is a range sensor of a TOF type, a phenomenon that a detected distance to the detection object 121 is output as a distance shorter than an actual distance occurs.

Figure 8:
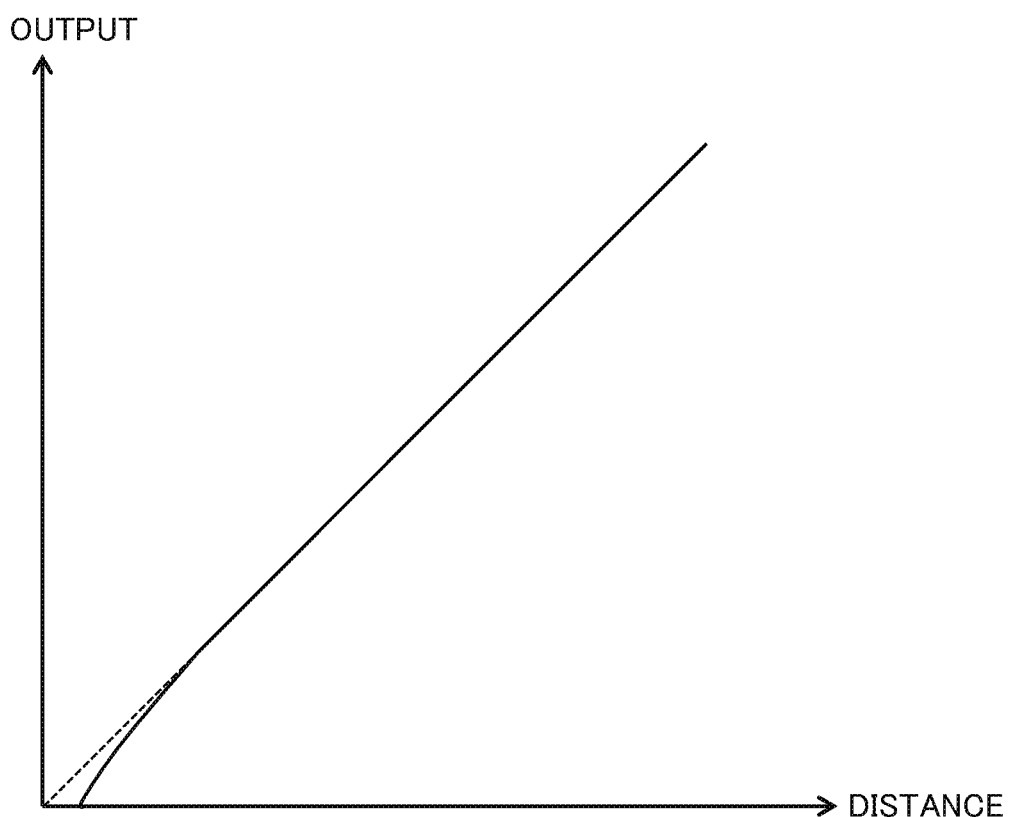
FIG. 8 is a correlation diagram illustrating an example of a relationship between a sensor output of the light detection device according to Embodiment 1 of the invention and a distance to a detection object.

FIG. 8 is a correlation diagram illustrating an example of a relationship between a sensor output of the light detection device according to Embodiment 1 and a distance to the detection object.

A broken line in the figure indicates characteristics of the light detection device that includes the SPAD photon detection rate controller 108 and has the light emission amount of the VCSEL 103 controlled, and a solid line in the figure indicates characteristics of a light detection device that does not include the SPAD photon detection rate controller 108.

Next, the distance calculation circuit 112 calculates, as a distance, a time difference between centers of gravity of histograms from the histogram generation circuit 111. Thereby, the light detection device 101 is able to calculate the distance from the light detection device 101 to the detection object 121.

Finally, distance data that is calculated is stored in the data register 113.

In a case where the distance between the light detection device 101 and the detection object 121 is continuously measured, periods that pass in order of the pre-measurement setting period 501, the distance measurement period 502, the distance measurement period 503, and a pause period are set as one set of a sequence and the measurement is repeated, as illustrated in FIG. 5. By performing setting of the quenching resistance value and setting of the VHV voltage at all times before the measurement of the distance, more accurate control with the reverse bias voltage of the SPAD array 104 and the SPAD array 105 is able to be performed. In the pause period, any adjustment is performed in accordance with frequency at which the distance between the light detection device 101 and the detection object 121 is measured. This makes it possible to prevent excessive burden on the light detection device 101.

Embodiment 2

Figure 9:
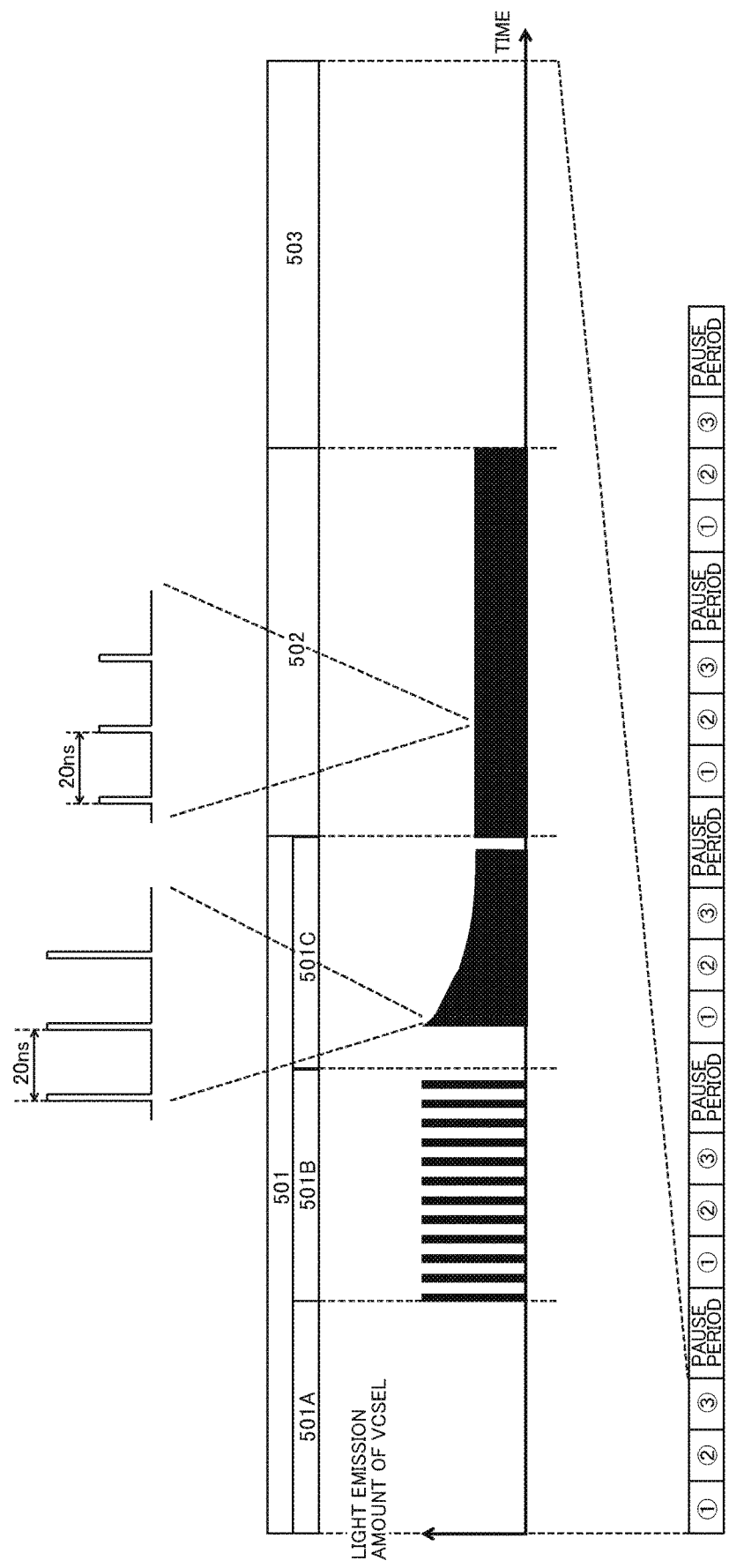
FIG. 9 is a sequence diagram illustrating an example of an operation of a light detection device according to Embodiment 2 of the invention.
Figure 10:
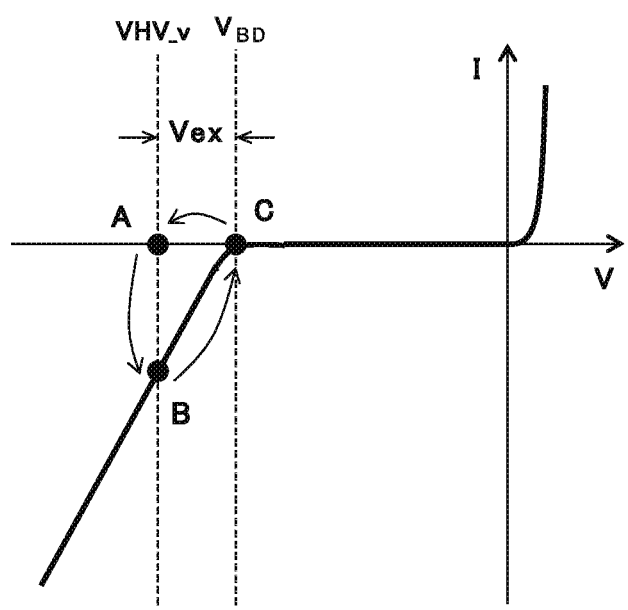
FIG. 10 is a graph illustrating an example of an operation state in Geiger mode in an avalanche photodiode.

Another embodiment of the invention will be described as follows with reference to FIG. 9. Note that, for convenience of description, a member having the same function as that of the member described in Embodiment 1 described above will be given the same reference sign and description thereof will be omitted.

An operation of the light detection device 101 in Embodiment 2 will be described with reference to FIG. 9. FIG. 9 is a sequence diagram illustrating the operation of the light detection device 101 according to Embodiment 2 of the invention.

The light detection device 101 in Embodiment 2 is different from the light detection device 101 according to Embodiment 1 described above only in a SPAD photon detection rate setting period 501C'.

In the SPAD photon detection rate setting period 501C' according to the present embodiment, intensity of light emission of the VCSEL 103 is adjusted to be reduced by changing the driving current of the VCSEL by the VCSEL driver 102 in a stepwise manner on the basis of an output from the SPAD photon detection rate controller 108 until the photon detection rate is below the first setting value.

Specifically, according to Embodiment 2, in the SPAD photon detection rate setting period 501C', the SPAD photon detection rate setting period 501C' is sectioned each predetermined time, the photon detection rate is calculated by the SPAD photon detection rate controller 108 every predetermined time, and the resultant is compared to the first setting value. Then, when the photon detection rate for each predetermined time is larger than the first setting value, the SPAD photon detection rate controller 108 outputs a control signal to the VCSEL driver 102 to reduce the light emission amount of the VCSEL 103. Then, the VCSEL driver 102 reduces the light emission amount of the VCSEL 103 on the basis of the control signal. An example in which such an operation is repeatedly performed multiple times in the SPAD photon detection rate setting period 501C' is indicated in FIG. 9. Note that, as the predetermined time described above, for example, a time during which ten pulse light beams are output by the VCSEL 103 is set as one predetermined time.

According to Embodiment 2, by reducing the photon detection rate of the SPAD array 105 to be the first setting value or less in a stepwise manner, the light emission amount of the VCSEL 103 is able to be optimized and accurately controlled so that the SPAD array 105 is not operated in the saturated operation region, thus making it possible to achieve higher accuracy.

The light detection device 101 described above may be included in an electronic apparatus. An example of the electronic apparatus includes a mobile information terminal such as a smartphone. Thereby, by including the light detection device 101, the electronic apparatus is able to achieve size reduction, and to have a function of measuring a distance between the electronic apparatus and the detection object 121 and further have versatility for the distance to the detection object 121 and reflectivity of the detection object 121.

For example, when the light detection device 101 is used for a small-sized proximity sensor of a TOF type, the small-sized proximity sensor is able to be used to activate a structured light camera for face authentication of a smartphone and is able to accurately detect even a detection object having different reflectivity with low power consumption and in a range of a relatively short distance (for example, 0 cm to 50 cm). The small-sized proximity sensor of the TOF type is able to detect and output also a distance to a detection object at the same time, so that the structured light camera for face authentication is able to be activated quickly.

Note that, the invention is not limited to the embodiments described above and can be modified, and the configuration indicated above may be replaced with a configuration that is substantially identical, that provides the identical effect, or that achieves the same purpose.

What is claimed is:

1. A light detection device comprising:
    a first SPAD array on which at least one first light beam that is at least one pulse light beam emitted from a light-emitting unit is incident and which is operated in Geiger mode;
    a second SPAD array on which at least one second light beam resulting from the at least one first light beam reflected by a detection object is incident and which is operated in Geiger mode;
    a voltage generation unit that applies a reverse bias voltage to the first SPAD array and the second SPAD array; and
    a SPAD photon detection rate controller that adjusts and controls a SPAD photon detection rate in accordance with a first photon detection rate indicating a rate of the number of at least one pulse signal output by the second SPAD array upon incidence of the at least one second light beam relative to the number of the at least one pulse light beam.

2. The light detection device according to claim 1, wherein the SPAD photon detection rate controller controls a light emission amount of the light-emitting unit in accordance with whether or not the first photon detection rate exceeds a first setting value that is set in advance.

3. The light detection device according to claim 1, wherein the SPAD photon detection rate controller controls the voltage generation unit in accordance with whether or not the first photon detection rate exceeds a first setting value that is set in advance.

4. The light detection device according to claim 1, wherein the SPAD photon detection rate controller controls the number of SPADs that constitute at least one SPAD array of the first SPAD array and the second SPAD array in accordance with whether or not the first photon detection rate exceeds a first setting value that is set in advance.

5. The light detection device according to claim 1, wherein the SPAD photon detection rate controller controls a light emission amount of the light-emitting unit in accordance with whether or not the second SPAD array is in a saturated operation region above a normal operation region due to incidence of the at least one second light beam.

6. The light detection device according to claim 1, wherein the SPAD photon detection rate controller performs control so that the first photon detection rate is 30% or more and 70% or less.

7. The light detection device according to claim 1, wherein the SPAD photon detection rate controller controls a light emission amount of the light-emitting unit before a distance between the light detection device and the detection object is measured.

8. The light detection device according to claim 1, wherein the SPAD photon detection rate controller controls a light emission amount of the light-emitting unit in accordance with a second photon detection rate indicating a rate of the number of at least one pulse signal output by the first SPAD array upon incidence of the at least one first light beam relative to the number of the at least one pulse light beam.

9. The light detection device according to claim 1 further comprising:
    a histogram generation unit that generates a first histogram based on at least one pulse signal output by the first SPAD array and a second histogram based on the at least one pulse signal output by the second SPAD array; and
    a distance calculation unit that calculates a distance between the light detection device and the detection object in accordance with a center of gravity of the first histogram that is generated by the histogram generation unit and a center of gravity of the second histogram that is generated by the histogram generation unit.

10. An electronic apparatus comprising the light detection device according to claim 1.

* * * * *